（12）United States Patent
Cheng et al.

(10) Patent No.: US 9,627,491 B2
(45) Date of Patent: Apr. 18, 2017

(54) ASPECT RATIO TRAPPING AND LATTICE ENGINEERING FOR III/V SEMICONDUCTORS

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/098,683

(22) Filed: Apr. 14, 2016

(65) Prior Publication Data

US 2016/0225861 A1 Aug. 4, 2016

Related U.S. Application Data

(62) Division of application No. 14/541,179, filed on Nov. 14, 2014, now Pat. No. 9,349,809.

(51) Int. Cl.
*H01L 29/267* (2006.01)
*H01L 21/02* (2006.01)
(Continued)

(52) U.S. Cl.
CPC ........ *H01L 29/267* (2013.01); *H01L 21/0245* (2013.01); *H01L 21/02236* (2013.01); *H01L 21/02318* (2013.01); *H01L 21/02381* (2013.01); *H01L 21/02538* (2013.01); *H01L 21/02639* (2013.01); *H01L 21/18* (2013.01);
(Continued)

(58) Field of Classification Search
CPC ............ H01L 29/267; H01L 21/02236; H01L 21/76224; H01L 21/02538; H01L 21/02318; H01L 21/0245; H01L 29/0649; H01L 29/32; H01L 21/02639; H01L 21/02381; H01L 21/18
See application file for complete search history.

(56) References Cited

U.S. PATENT DOCUMENTS 7,071,087 B2 7/2006 Yang et al.
7,749,829 B2 7/2010 Karve et al.
(Continued)

FOREIGN PATENT DOCUMENTS

JP 62137871 A 6/1987
JP 6490524 A 4/1998
(Continued)

OTHER PUBLICATIONS

IBM, List of IBM Patents or Patent Applications Treated as Related, Appendix P, dated Apr. 20, 2016, 2 pages.
(Continued)

*Primary Examiner* — Tucker J Wright
(74) *Attorney, Agent, or Firm* — L. Jeffrey Kelly

(57) ABSTRACT

A semiconductor structure including a III/V layer on a SiGe layer, edges of the SiGe layer are relaxed, the III/V layer is a semiconductor in a III/V semiconductor group, the SiGe layer is directly on an insulator layer, barrier layers on two adjacent sides of the SiGe layer and the III/V layer, and the barrier layer is directly on the insulator layer.

4 Claims, 4 Drawing Sheets

(51) Int. Cl.
    *H01L 21/762*     (2006.01)
    *H01L 21/18*     (2006.01)
    *H01L 29/06*     (2006.01)
    *H01L 29/32*     (2006.01)

(52) U.S. Cl.
    CPC .... *H01L 21/76224* (2013.01); *H01L 29/0649* (2013.01); *H01L 29/32* (2013.01)

(56) References Cited

U.S. PATENT DOCUMENTS

| | | | |
|---|---|---|---|
| 7,799,592 | B2 | 9/2010 | Lochtefeld |
| 7,915,645 | B2 | 3/2011 | Briere |
| 8,119,494 | B1 | 2/2012 | Vellianitis |
| 8,173,551 | B2 | 5/2012 | Bai et al. |
| 8,216,951 | B2 | 7/2012 | Cheng et al. |
| 8,274,097 | B2 | 9/2012 | Cheng |
| 8,324,660 | B2 | 12/2012 | Lochtefeld et al. |
| 8,415,718 | B2 | 4/2013 | Xu |
| 2010/0301396 | A1 | 12/2010 | Briere |
| 2011/0136325 | A1 | 6/2011 | Briere |
| 2011/0303273 | A1* | 12/2011 | Harper .................. H01L 31/18 136/255 |
| 2011/0303291 | A1* | 12/2011 | Harper ............. H01L 21/76254 136/261 |
| 2012/0256188 | A1 | 10/2012 | McDonald et al. |
| 2012/0256189 | A1 | 10/2012 | McDonald et al. |
| 2012/0273840 | A1 | 11/2012 | Luo et al. |

FOREIGN PATENT DOCUMENTS

| | | |
|---|---|---|
| JP | 11163399 A | 6/1999 |
| WO | 20080073529 A2 | 6/2008 |

OTHER PUBLICATIONS

Pending U.S. Appl. No. 14/541,179, filed Nov. 14, 2014, Entitled: "Aspect Ratio Trapping and Lattice Engineering for III/IV Semiconductors", 19 Pages.

Pending U.S. Appl. No. 13925911, entitled: "Semiconductor Structure With Aspect Ratio Trapping Capabilities", filed on Jun. 25, 2013.

Heyns et al., "Challenges for introducing Ge and III/V devices into CMOS technologies", 2012 IEEE, pp. 5d.1.1-5D.1.10.

Li et al., "Defect reduction of GaAs epitaxy on Si (001) using selective aspect ratio trapping", Applied Physics Letters vol. 91, No. 021114, (2007), pp. 021114-1-021114-3.

"Solid State Physics", Proceedings of the 57th DAE Solid State Physics Symposium 2012, Indian Institute of Technology, Bombay, Mumbai, India, Dec. 3-7, 2012, Solid State Physics (India) vol. 57 (2012).

Bhattacharya et al., "Designing a new class of III-IV-V semiconductor nanosheets", AIP Conference Proceedings, vol. 1512, G. Electronic Structure and Phonons, Solid State Physics: Proceedings of the 57th DAE Solid State Physics Symposium 2012, Date: Dec. 3-7, 2012, Accessed on Jun. 17, 2013, DOI: http://dx.doi.org/10.1063/1.4791305, pp. 850-851.

Pending U.S. Appl. No. 14/541179, filed Nov. 14, 2014, entitled: "Aspect Ratio Trapping and Lattice Engineering for III/V Semiconductors", pp. 1-19.

* cited by examiner

ASPECT RATIO TRAPPING AND LATTICE ENGINEERING FOR III/V SEMICONDUCTORS

CROSS-REFERENCE

The present application is a divisional of, and claims priority under 35 U.S.C. §120, U.S. patent application Ser. No. 14/541,179, filed on Nov. 14, 2014, which is incorporated by reference in its entirety.

BACKGROUND

The present invention generally relates to semiconductor device manufacturing, and more particularly to the fabrication of a III/V semiconductor material on a silicon-germanium (SiGe) layer.

The increasing operating speeds and computing power of microelectronic devices have recently given rise to the need for an increase in the complexity and functionality of the semiconductor structures from which that these devices are fabricated. Hetero-integration of dissimilar semiconductor materials, for example, III/V materials, such as gallium arsenide, gallium nitride, indium aluminum arsenide, and/or germanium with silicon or silicon-germanium substrate, is an attractive path to increasing the functionality and performance of the CMOS platform. In particular, heteroepitaxial growth can be used to fabricate many modern semiconductor devices where lattice-matched substrates are not commercially available or to potentially achieve monolithic integration with silicon microelectronics. Performance and, ultimately, the utility of devices fabricated using a combination of dissimilar semiconductor materials, however, depends on the quality of the resulting structure. Specifically, a low level of dislocation defects is important in a wide variety of semiconductor devices and processes, because dislocation defects partition an otherwise monolithic crystal structure and introduce unwanted and abrupt changes in electrical and optical properties, which, in turn, results in poor material quality and limited performance. In addition, the threading dislocation segments can degrade physical properties of the device material and can lead to premature device failure.

Dislocation defects typically arise in efforts to epitaxially grow one kind of crystalline material on a substrate of a different kind of material, often referred to as "heterostructure," due to different crystalline lattice sizes of the two materials. This lattice mismatch between the starting substrate and subsequent layer(s) creates stress during material deposition that generates dislocation defects in the semiconductor structure.

Integrating III/V semiconductors on a silicon substrate may be very challenging due to the large lattice constant mismatch between III/V semiconductors (5.6-6.4 Å) and silicon (5.4 Å). Aspect ratio trapping has been used as one way to enable integration of the III/V on silicon.

SUMMARY

According to an embodiment of the present invention, a structure is provided. The structure may include a III/V layer on a SiGe layer, edges of the SiGe layer are relaxed, the III/V layer is a semiconductor in a III/V semiconductor group, the SiGe layer is directly on an insulator layer, barrier layers on adjacent sides of the SiGe layer and the III/V layer, and the barrier layer is directly on the insulator layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
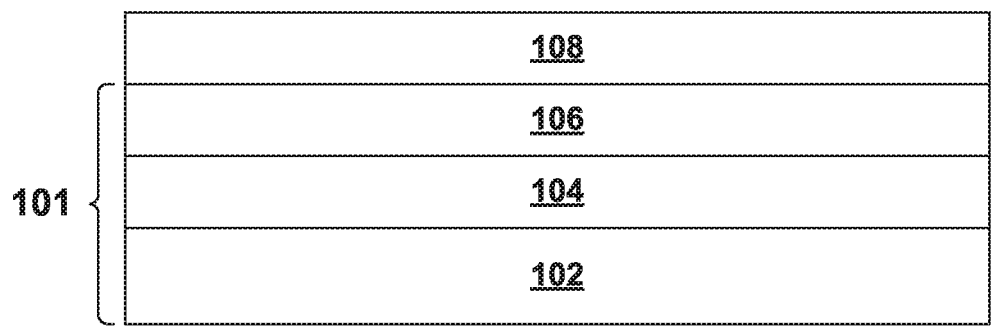
FIG. 1 is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It may be ideal to have an nFET region of a substrate having a larger lattice constant, closer to a III/V semiconductor, to allow for good nFET device formation, while leaving a pFET region of the substrate having a lower lattice constant to allow for good pFET device formation. The term "good" in reference to the "device formation" may refer to fewer defects because of a smaller lattice constant mismatch between two semiconductor materials.

The present invention generally relates to semiconductor device manufacturing, and more particularly to the fabrication of a III/V semiconductor on a silicon-germanium (SiGe) layer having relaxed edges, where the SiGe layer having relaxed edges has a lattice constant between the lattice constant of relaxed SiGe and relaxed silicon (Si). One way to form a III/V layer on a SiGe layer having relaxed edges is to form a silicon-germanium-on-insulator (SGOI) substrate using a Ge-condensation process, forming a hardmask on the SGOI, forming trenches in the hardmask, where the trenches extend through a SiGe layer and relaxing edges of the SiGe layer, filling the trench with an isolation material, removing the hardmask, and growing a III/V layer on the SiGe layer having relaxed edges.

Referring now to FIG. 1, a structure 100 is illustrated during an intermediate step of a method of fabricating a III/V layer on a SiGe layer having relaxed edges (hereinafter "relaxed SiGe layer"), according to an embodiment. More specifically, the method can start with growing a SiGe layer 108 on a first semiconductor layer 106.

The first semiconductor layer 106 may be any type of substrate including, for example, a silicon-on-insulator (SOI) substrate or a bulk substrate. In an embodiment, the first semiconductor layer 106 is a top layer of a SOI substrate 101, where the SOI substrate 101 includes the first semiconductor layer 106, an insulator layer 104 and a base substrate 102. The first semiconductor layer 106 may be on the insulator layer 104 and the insulator layer 104 may be on the base substrate 102. It should be noted, the insulator layer 104 may also be referred to as a buried dielectric layer or a buried oxide (BOX) layer.

The SOI substrate 101 may be formed using standard techniques known in the art, such as, for example, Separation by Ion Implantation of Oxygen (SIMOX) or layer transfer. When a layer transfer process is employed, an optional thinning step may follow the bonding of two semiconductor wafers together. The optional thinning step can reduce the thickness of a layer to a desirable thickness.

In some embodiments, the base substrate 102 and the first semiconductor layer 106 may include a same or similar semiconductor material. In other embodiments, the base substrate 102 and the first semiconductor layer 106 may include a different semiconductor material. The term "semiconductor" as used herein may denote any semiconducting material including, for example, Si, Ge, SiGe, SiC, SiGeC, InAs, GaAs, InP or other semiconductors. Multi-layers of these semiconductor materials can also be used as the semiconductor material of the base substrate 102 and the first semiconductor layer 106. In an embodiment, the base substrate 102 and the first semiconductor layer 106 both include silicon. In some embodiments, the base substrate 102 is a non-semiconductor material including, for example, a dielectric material and/or a conductive material.

In an embodiment, the base substrate 102 and the first semiconductor layer 106 may have the same or different crystal orientation. For example, the crystal orientation of the base substrate 102 and/or the first semiconductor layer 106 may be {100}, {110}, or {111}. Other crystallographic orientations besides those specifically mentioned can also be used. The base substrate 102 and/or the first semiconductor layer 106 may be a single crystalline semiconductor material, a polycrystalline material, or an amorphous material. Typically, at least the first semiconductor layer 106 is a single crystalline semiconductor material. In some embodiments, the first semiconductor layer 106 that is located above the insulator layer 104 can be processed to include semiconductor regions having different crystal orientations.

The thickness of the first semiconductor layer 106 may be typically from about 5 nm to about 100 nm. In an embodiment, the thickness of the first semiconductor layer 106 may be between 5 nm to 10 nm. In some embodiments, an extremely thin semiconductor-on-insulator (ETSOI) substrate may be used, where the first semiconductor layer 106 can have a thickness of less than 5 nm.

The first semiconductor layer 106 may be doped, undoped or contain doped and undoped regions therein. For clarity, the doped regions are not specifically shown in the drawings of the present embodiment. Each doped region within the first semiconductor layer 106 may have the same, or may have different, conductivities and/or doping concentrations. The doped regions that are present in the first semiconductor layer 106 can be formed by ion implantation process or gas phase doping.

The insulator layer 104 may be a crystalline or non-crystalline oxide or nitride. In an embodiment, the insulator layer 104 is an oxide, such as, for example, silicon dioxide. The insulator layer 104 may be continuous or discontinuous. The insulator layer 104 may typically have a thickness from about 1 nm to about 500 nm. In an embodiment, the insulator layer 104 may have a thickness ranging from about 10 nm to about 100 nm. In an alternative embodiment, the insulator layer 104 may include multiple dielectric layers or a stack of dielectric layers including a silicon oxide layer and/or a silicon nitride layer.

With continued reference to FIG. 1, the SiGe layer 108 may be grown on the SOI substrate 101 using any formation technique known in the art, such as, for example, epitaxial growth. A layer grown using epitaxy may be a layer of monocrystalline semiconductor material, which may grow outward from an exposed surface of an existing monocrystalline semiconductor material. The epitaxial layer may have the same composition as the semiconductor region on which it is grown (e.g., the semiconductor material), the same impurities (e.g., dopants and their concentrations). Alternatively, the compositions of the epitaxial layer and the underlying semiconductor region can be different. Sometimes, the epitaxial layer has characteristics that allow the epitaxial layer to impart a stress to the semiconductor region on which it is grown. For example, an epitaxial layer can impart a stress to an adjoining semiconductor region when the epitaxial layer includes a semiconductor alloy material different from the adjoining semiconductor region (e.g., having a lattice mismatch). Epitaxial films are typically defect-free compared to other deposition methods.

The SiGe layer 108 may be formed on the first semiconductor layer 106, where both layers retain their respective crystalline structures. However, the SiGe layer 108 may have a distorted crystalline structure, matching the first semiconductor layer 106. The SiGe layer 108 may be distorted because the crystalline lattice has elasticity, where thin epitaxial layers can distort to match a seed layer crystalline structure. In an embodiment, the SiGe layer 108 may be compressively strained (i.e., the SiGe layer 108 has a similar lattice to silicon). The thickness of the SiGe layer 108 may range from about 3 nm to about 100 nm depending on a Ge concentration in the SiGe layer 108. Thicker layers of SiGe may introduce dislocations (i.e., the SiGe may begin to relax).

Figure 2:
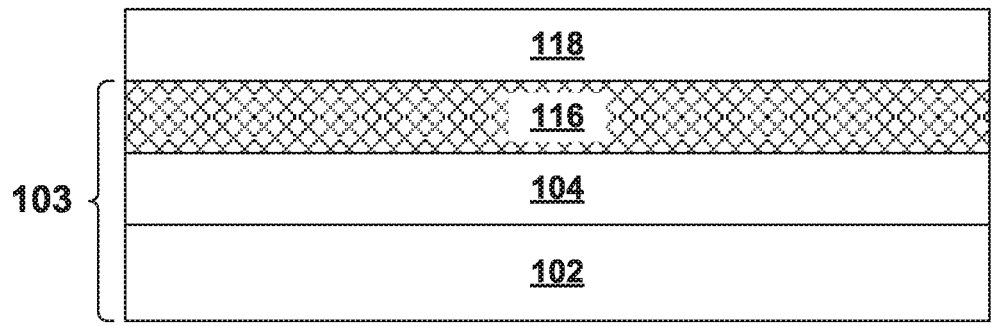
FIG. 2 is a cross section view of the semiconductor structure and illustrates the formation of a strained SiGe layer, according to an exemplary embodiment.

Referring now to FIG. 2, a structure 100 is illustrated during an intermediate step of a method of fabricating a III/V layer on a relaxed SiGe layer, according to an embodiment. More specifically, the method can include oxidizing the structure 100 to displace germanium atoms in the SiGe layer 108 into the first semiconductor layer 106 using a Ge-condensation process.

A Ge-condensation process may be used to produce a SGOI substrate 103, including, for example, a strained SiGe layer 116 on the insulator layer 104, where the insulator layer 104 is on the base substrate 102. The Ge-condensation process may include condensing germanium atoms of the SiGe layer 108 into the first semiconductor layer 106. The Ge-condensation process may be performed by oxidizing the structure 100 in $O_2$ atmosphere at a high temperature, such as, for example, above 1000° C. Under these conditions, the SiGe layer 108 may become an oxide layer 118 on the strained SiGe layer 116, as is know in the art. During oxidation, the germanium atoms within the SiGe layer 108 are rejected from the oxide layer 118 and forced into the first semiconductor layer 106 below, forming the strained SiGe layer 116. The interface between the SiGe layer 108 and the first semiconductor layer 106 may be diminished by the inter-diffusion of silicon atoms and germanium atoms. In an embodiment, the strained SiGe layer 116 may have a lattice constant similar to a lattice constant of silicon because the germanium atoms were condensed into the first semiconductor layer 106. The strained SiGe layer 116 may be fully strained SiGe or partially strained SiGe.

Figure 3:
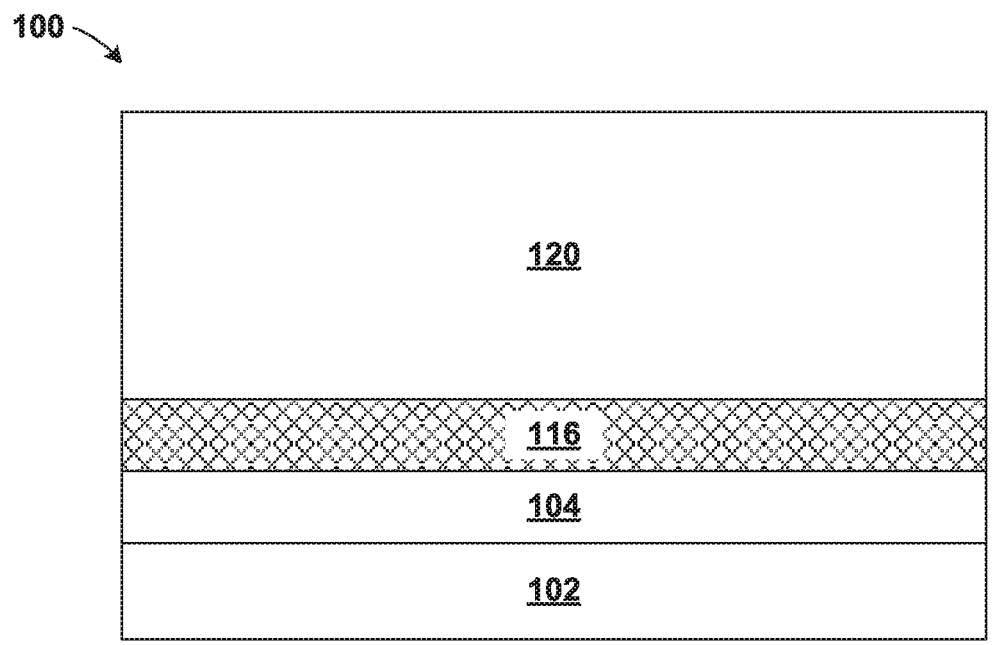
FIG. 3 is a cross section view of the semiconductor structure and illustrates the formation of a hardmask layer on the strained SiGe layer, according to an exemplary embodiment.

Referring now to FIG. 3, a structure 100 is illustrated during an intermediate step of a method of fabricating a III/V layer on a relaxed SiGe layer, according to an embodiment. More specifically, the method can include removing the oxide layer 118 and forming a hardmask 120 on the strained SiGe layer 116.

The oxide layer 118 may be removed using any known removal technique known in the art, such as, for example, reactive ion etching (RIE) or chemical-mechanical polishing (CMP). The hardmask 120 may be formed on the strained SiGe layer 116 using any mask formation technique known in the art, such as, for example, spin coating and may include multiple layers. The hardmask 120 may include any masking materials known in the art, such as, for example, organic resist coatings or patterning layers. The hardmask 120 may have a thickness ranging from about 20 nm to about 100 nm.

Figure 4:
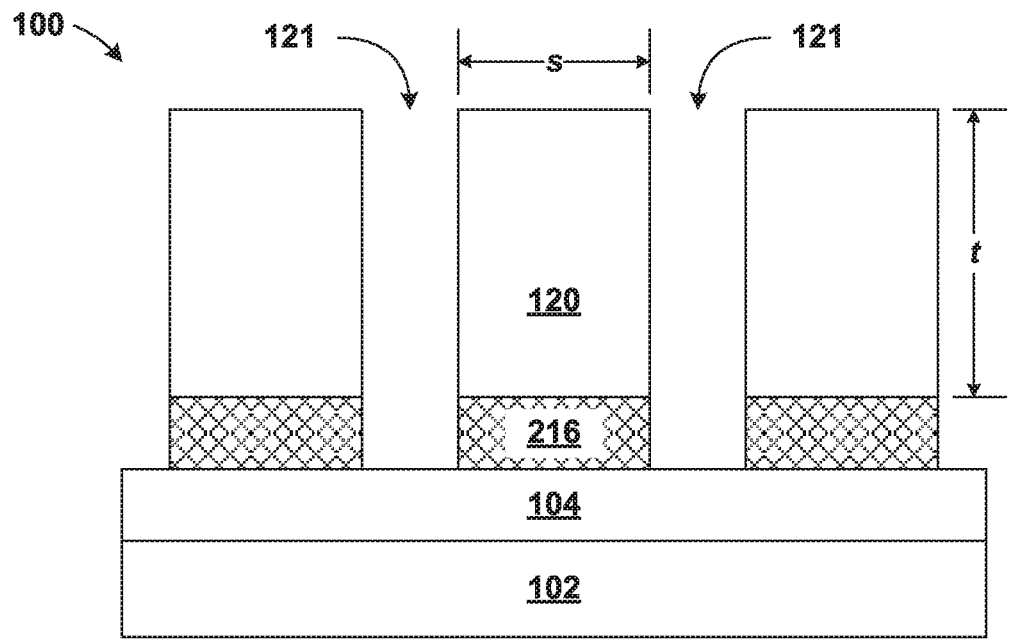
FIG. 4 is a cross section view of the semiconductor structure and illustrates the formation of a first trench in the hardmask, according to an exemplary embodiment.

Referring now to FIG. 4, a structure 100 is illustrated during an intermediate step of a method of fabricating a III/V layer on a relaxed SiGe layer, according to an embodiment. More specifically, the method can include forming first trenches 121 to relax edges of the strained SiGe layer 116.

The first trenches 121 may be formed in the hardmask 120 and in the strained SiGe layer 116. The first trenches 121 may cause the strained SiGe layer 116 to have free edges coplanar with trench sidewalls. Edge relaxation may occur, where the strained SiGe layer 116 partially relaxes at the free edges, becoming a relaxed SiGe layer 216. The relaxed SiGe layer 216 may be partially relaxed or fully relaxed. It should be noted, the relaxed SiGe layer 216 may have a relaxation gradient where the lattice constant of the relaxed SiGe layer 216 at the free edges is larger than a lattice constant of a center region of the relaxed SiGe layer 216. The relaxed SiGe layer 216 may have a resulting lattice constant between a lattice constant of relaxed SiGe and a lattice constant of relaxed Si. The first trenches 121 may have a first distant (s) between adjacent first trenches 121, the first distant (s) may be greater-than-or-equal-to a hardmask thickness (t). The first distance (s) and the hardmask thickness (t) may be adjusted for subsequent device formation.

Figure 5:
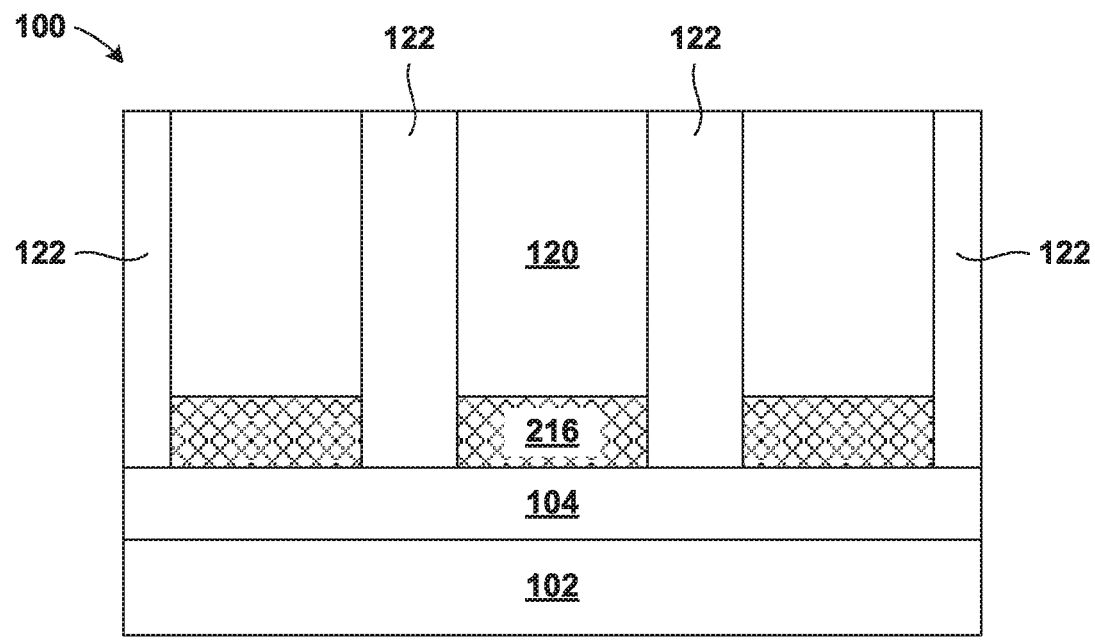
FIG. 5 is a cross section view of the semiconductor structure and illustrates the formation of a barrier layer in the first trench, according to an exemplary embodiment.

Referring now to FIG. 5, a structure 100 is illustrated during an intermediate step of a method of fabricating a III/V layer on a relaxed SiGe layer, according to an embodiment. More specifically, the method can include forming barrier layers 122 in the first trenches 121.

The barrier layers 122 may be formed in the first trenches 121 using any deposition technique known in the art, such as, for example, atomic layer deposition (ALD), molecular layer deposition (MLD), chemical vapor deposition (CVD), in-situ radical assisted deposition, metalorganic chemical vapor deposition (MOCVD), or any combination thereof. The barrier layers 122 may include any barrier materials known in the art, such as, for example, silicon dioxides, silicon nitrides, silicon oxynitrides, or other dielectric materials.

Figure 6:
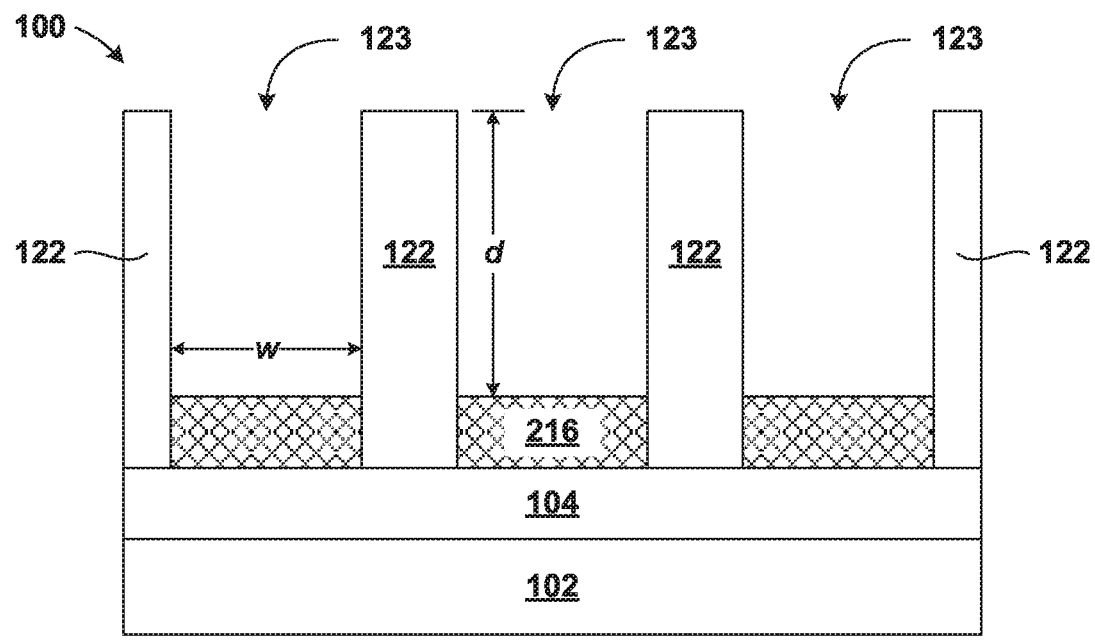
FIG. 6 is a cross section view of the semiconductor structure and illustrates the formation of a second trench, according to an exemplary embodiment.
Figure 7:
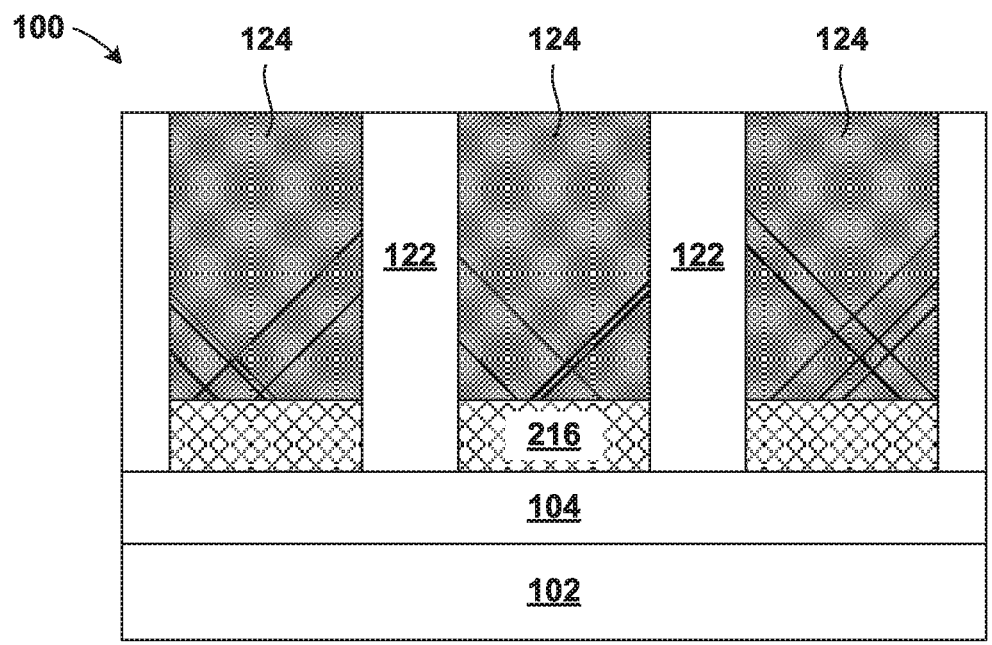
FIG. 7 is a cross section view of the semiconductor structure and illustrates the formation of a III/V semiconductor material in the second trench, according to an exemplary embodiment.

Referring now to FIGS. 6 and 7, a structure 100 is illustrated during an intermediate step of a method of fabricating a III/V layer on a relaxed SiGe layer, according to an embodiment. More specifically, the method can include forming a second semiconductor 124 in a second trench 123.

The second trench 123 may be formed by removing the hardmask 120. The hardmask 120 may be removed using any removal technique known in the art, such as, for example, reactive ion etching (RIE). The second trench 123 may be a remaining opening after the hardmask 120 is removed. The second trench 123 may expose a top surface of the relaxed SiGe layer 216. The second trench 123 may be in-between adjacent barrier layers 122.

The second trench 123 may be substantially rectangular in terms of its cross-sectional profile, a top view, or both. The second trench 123 may have a depth (d), for example, of about 0.05 μm to about 5 μm. The depth (d) may be equal to the thickness (t) of the hardmask 120. The second trench 123 may have a width (w) that may be less than about 500 nm (e.g., about 10 nm to about 100 nm). The length (not shown) may exceed each of the width (w) and the depth (d). A ratio of the width (w) to the depth (d) may be greater than, or equal to, 0.5, and in some embodiments greater than 1. The ratio of the depth (d) to the width (w) may allow for aspect ratio trapping for subsequent semiconductor growth within the second trench 123, as is known in the art.

By using an of aspect ratio trapping technique, threading dislocations from growing a first semiconductor material on second semiconductor material may be trapped by sidewalls of a trapping material. Aspect ratio trapping may allow for the formation of a defect free region of first semiconductor material. As used herein "aspect ratio trapping" (ART) refers generally to a technique of causing defects to terminate at sidewalls of a structure where the sidewalls are sufficiently high relative to the size of an ART region so as to trap most, if not all, of the defects. The ART region may be the area between the sidewalls of the structure that contains the defects. The ART region may vary due to the type of material, its crystal structure, and other variables.

The second semiconductor layer 124 may be formed in the second trench 123 on the relaxed SiGe layer 216, using any formation technique known in the art, such as, for example, metal-organic chemical vapor deposition (MOCVD), atmospheric pressure CVD (APCVD), reduced-pressure CVD (LPCVD), ultra-high-vacuum CVD (UHVCVD) molecular beam epitaxy (MVE), or atomic layer deposition (ALD). The second semiconductor layer 124 may be a group III/V semiconductor compound, such as, for example, GaP, GaSb, GaN, InP, InAs, InN, InSb, AN, AlAs, AlSb, AlP and/or their ternary or quaternary compounds. In an embodiment, the second semiconductor layer 124 may be GaAs.

As the second semiconductor layer 124 is being grown, defects, such as threading dislocations in the second semiconductor layer 124 can reach and terminate at the sidewalls of the barrier layer 122. The defects may terminate at, or below, a vertical predetermined ART distance from the surface of the barrier layer 122, such as, for example, depth (d) described above. The second semiconductor layer 124 may be smoothed by a chemical-mechanical planarization (CMP) process if needed.

An embodiment of the invention may create an nFET region having a relaxed SiGe layer having a lattice constant larger than the lattice constant of relaxed Si and a lower lattice constant than the lattice constant of relaxed SiGe. The relaxed SiGe layer may provide a seed layer to form a III/V semiconductor having fewer defects because of a smaller lattice mismatch between the seed layer and the III/V semiconductor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a III/V layer on a SiGe layer, edges of the SiGe layer are relaxed, the III/V layer is a semiconductor in a III/V semiconductor group, the SiGe layer is directly on an insulator layer; and
   barrier layers on two adjacent sides of the SiGe layer and the III/V layer, the barrier layer is directly on the insulator layer.

2. The structure of claim 1, wherein the barrier layer has a layer height that is greater than double a layer width.

3. The structure of claim 1, wherein the III/V layer is directly on the relaxed edges of the SiGe layer.

4. The structure of claim 1, wherein defects in the III/V layer extend from the SiGe layer to the barrier layer.

* * * * *